FREQUENCY CONTROL LOOP INCLUDING A SYNCHRONOUS DETECTOR AND A FREQUENCY DISCRIMINATOR
Filed May 6, 1968 2 Sheets-Sheet 1

INVENTORS
RONALD R. SINCLAIR
RUSSELL B. HAWES
MARTIN R. RICHMOND
BY Harry A. Herbert Jr and George Fine
ATTORNEYS INVENTORS
RONALD R. SINCLAIR
RUSSELL B. HAWES
MARTIN R. RICHMOND
BY Harry A. Herbert Jr. and George Fine
ATTORNEYS United States Patent Office 3,514,712

Patented May 26, 1970

3,514,712

AUTOMATIC FREQUENCY CONTROL LOOP INCLUDING A SYNCHRONOUS DETECTOR AND A FREQUENCY DISCRIMINATOR

Ronald R. Sinclair, Burlington, Mass., Russell B. Hawes, Nashua, N.H., and Martin R. Richmond, Burlington, Mass., assignors to the United States of America as represented by the Secretary of the Air Force Filed May 6, 1968, Ser. No. 726,953

Int. Cl. H03b *3/04;* H03d *13/00*

U.S. Cl. 331—4 4 Claims

ABSTRACT OF THE DISCLOSURE

Apparatus for maintaining stability in a voltage-controlled oscillator by locking the oscillator to a crystal standard by a frequency control loop which includes a mixer to mix the oscillator output with that of the crystal standard, a synchronous detector to beat with the mixer output, and a discriminator to feed back a locking signal to the oscillator.

BACKGROUND OF THE INVENTION

This invention relates to apparatus for maintaining stability in a voltage-controlled oscillator and more particularly to locking the oscillator to a crystal standard by means of a frequency control feedback loop.

SUMMARY OF THE INVENTION

The present invention provides apparatus to maintain crystal oscillator stability at any point at which a broadband, swept, voltage-controlled oscillator (VCO) is stopped. The basic VCO is a varactor tuned swept L-C (inductance-capacitance) oscillator.

In accordance with the present invention the VCO output (for example 70–100 mc.) is folded over when mixed with a crystal controlled oscillator. The translated frequency (0–15 mc.) is now at a lower range that is suitable for efficient synchronous detector (SD) operation. This synchronous detector is pulsed on with short time duration pulses (such as 20–30 μsec.) at a preselected rate (such as 20 kilocycles). The resultant output is a repetitive beat frequency pattern occurring every 20 kc. as the VCO sweeps across the band. The synchronous detector output frequency ranges from 0 to 10 kc. and back to 0 as the VCO sweeps through 20 kc. This low frequency synchronous detector signal that varies directly with the VCO is fed to a discriminator centered for example, at 5 kc. The output of the discriminator is fed back to the VCO for a closed loop condition. Lock is achieved at discrete frequencies separated by an increment equal to the sampling rate (20 kc.).

With a slight modification to the closed loop system, instantaneous frequency readout is obtainable. Filtering of all but a small portion of the synchronous detector output provides periodic signals as the VCO is swept. These signals occur at intervals corresponding to the sampling rate and appear through the VCO band. Cumulative counting provides frequency readout available immediately after the VCO is stopped.

An object of the present invention is to provide apparatus to maintain oscillator stability.

Another object of the present invention is to provide apparatus to lock an oscillator to a crystal standard by utilization of a frequency control feedback loop.

Yet another object of the present invention is to provide apparatus including a feedback loop to stabilize an oscillator and which also includes a frequency readout system.

For a better understanding of the present invention, together with other and further objects thereof, reference is had to the following description taken in connection with the accompanying drawings, and its scope will be pointed out in the appended claims.

DESCRIPTION OF THE PREFERRED EMBODIMENT

Figure 1:
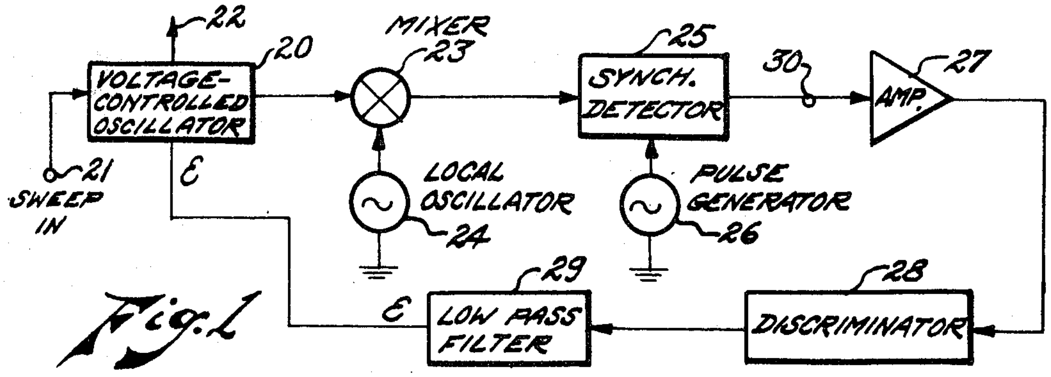
FIG. 1 is a block diagram of a swept voltage-controlled oscillator having a feedback loop to provide oscillator stability.

Now referring in detail to FIG. 1, there is shown voltage-controlled oscillator 20 which may be a varactor tuned R.F. oscillator. Oscillator 20 is swept in frequency by applying to aforesaid varactor a sweep signal which is received by way of input terminal 21. Oscillator 20 sweeps from 70 to 100 megacycles (mc.).

Mixer 23 receives simultaneously the output signals from swept voltage-controlled oscillator 20 and 85 megacycles (c.) crystall-controlled local oscillator 24. Since the voltage-controlled oscillator sweeps from 70 to 100 mc. and the local oscillator is centered in this band, a mixer output of 15 mc. to 0 to 15 mc. is obtained. The use of foldover of the mixer output requires the circuit following to have only one-half the bandwidth of the voltage-controlled oscillator. The smaller band is preferable since efficiency of following synchronous detector 25 decreases as the input frequency is increased. The lower frequency also allows a wider more efficient sampling pulse.

Figure 2:
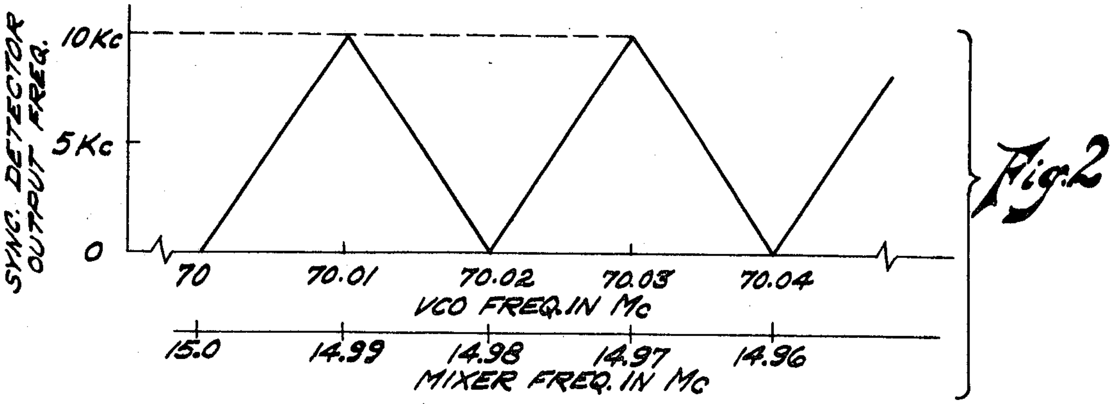
FIG. 2 shows a curve associated with the synchronous detector, voltage-controlled oscillator, and mixer components shown in FIG. 1 and illustrates the relationship of the synchronous detector frequency against the voltage-controlled oscillator and mixer frequency.

The output signal from mixer 23 is fed to synchronous detector 25 which is pulsed on with short time (approximately 20–30 microsecond) pulses at a 20 kilocycle rate by pulse generator 26. Synchronous detector 25 thus samples the mixer output at a 20 kc. rate. A frequency variation in swept voltage-controlled oscillator 20 causes a synchronous detector output of 0–10 kc. as shown in FIG. 2.

Figures 3, 4:
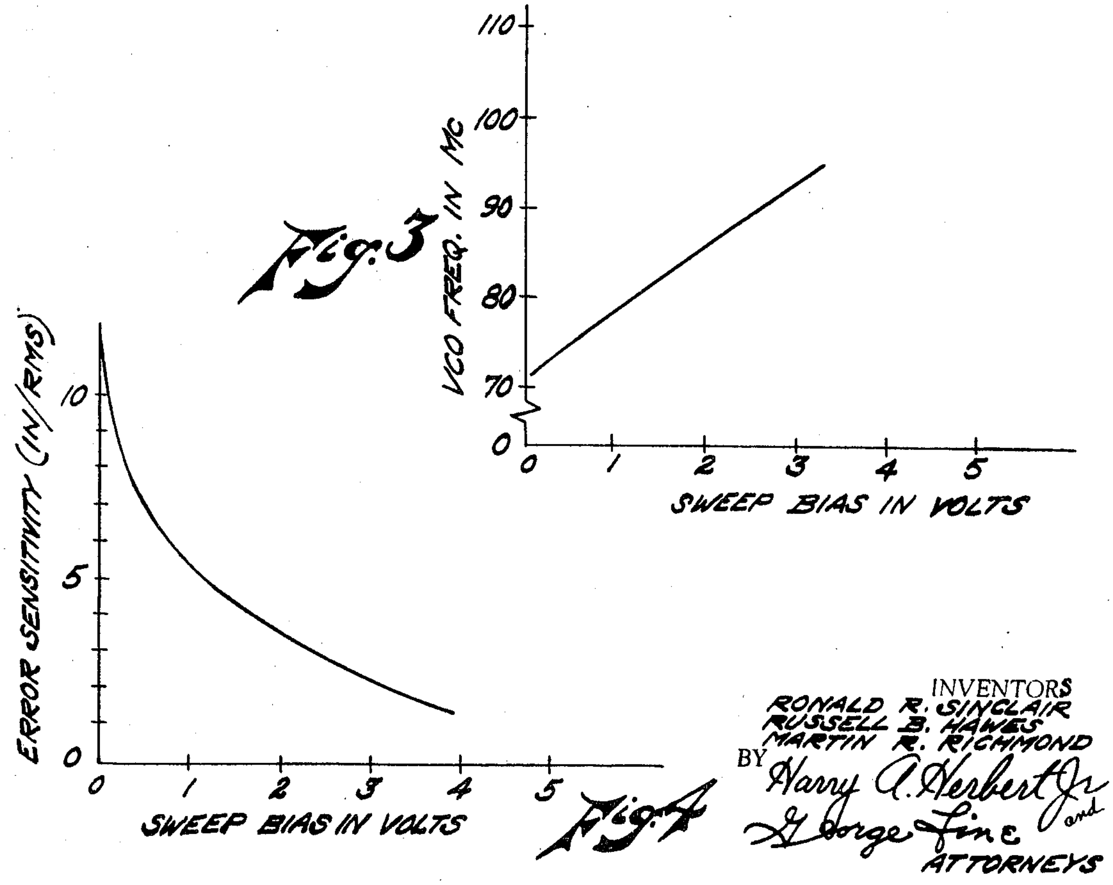
FIG. 3 shows a curve illustrating the voltage-controlled oscillator frequency against sweep bias.
FIG. 4 shows a plot illustrating an error sensitivity curve associated with the voltage-controlled oscillator.

Discriminator 28 centered at 5 kc. is driven by the output from 0–10 kc. amplifier 27 which in turn is fed by the output from synchronous detector 25. Ripple on the discriminator output is reduced by low-pass filter 29, and this error signal is then applied to voltage-controlled oscillator 20. As hereinbefore mentioned, voltage-controlled oscillator 20 is a varactor tuned R.F. oscillator. Thus the error signal may be applied to one side of aforesaid varactor, while the sweep signal is applied to the alternate side. Since varactors have non-linear characteristics, the sweep is shaped to obtain a linear voltage-controlled oscillator characteristic as shown in FIG. 3. An error sensitivity curve is shown in FIG. 4. This curve is not linear as there is no shaping circuit in the error feedback.

It is to be noted that since the output of a voltage-controlled oscillator is mixed with a crystal-controlled oscillator pulling may occur near zero. This may result when the oscillator with higher Q attempts to synchronize the other as their respective frequencies become nearly equal. Therefore if isolation between oscillators appears to be desirable a separate buffer amplifier for each oscillator may be provided.

Constant output across the band of interest is desirable and in aid thereof mixer 23 is of an active type and holds the gain constant to $\pm 1.5$ db across the band.

Figure 5:
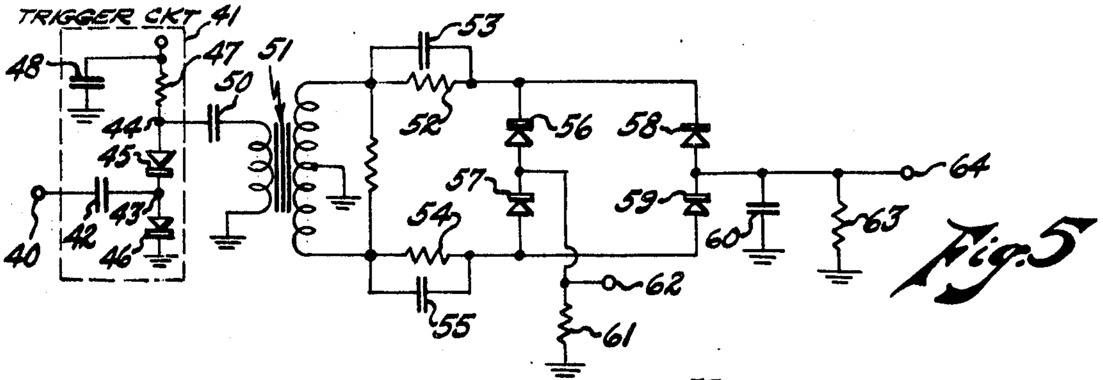
FIG. 5 shows a circuit diagram of the synchronous detector shown in FIG. 1.

A more detailed description is hereinafter provided. The synchronous detector of FIG. 1 is shown in one possible circuit diagram form as in FIG. 5. A 20 kc. pulse is applied by way of input terminal 40 to trigger circuit 41. Trigger circuit 41 is comprised of input capacitor 42 interconnected between terminals 41 and 43. Diode 45 is connected between terminals 43 and 44. Diode 46 interconnects terminal 43 and terminal 44 is connected to ground by way of resistor 47 and capacitor 48. The aforementioned 20 kc. pulse appears at terminal 44 and is applied to the series L-C circuit of capacitor 50 and the primary of pulse transformer 51. Ringing is utilized to obtain the pulse width required to perform the gating required. Pulse transformer 51 couples the gate to the diode bridge comprised of diodes 56–59. Resistor 47 damps the oscillation, allowing only the first cycle of the gate to overcome the back bias provided by the network comprised of resistor 52, capacitor 53 and resistor 54, capacitor 55.

During gate, boxcar capacitor 60 is effectively connected to input impedance 61. It is to be noted that the mixer input is received at terminal 62. Capacitor 60 charges up to the amplitude of the mixer signal. Upon removal of the gate, capacitor 60 discharges through resistor 63. Resistor 63 is large, such that the discharge of capacitor 60 is negligible between samples.

When the mixer output frequency, $fm$, is a multiple of 20 kc., consecutive samples will occur at the same phase on the mixer sinusoid. No frequency variation is present at capacitor 60. At $fm=N(20\text{ kc.})+\Delta f$, where N is a positive integer and $\Delta f<10$ kc., the sampling will occur at different points in the signal. The signal at capacitor 60 is now of frequency $\Delta f$. If $N=50$ and $\Delta f=5$ kc., $fm=1.005$ mc., the synchronous detector output from terminal 64 will be 5 kc.

The synchronous detector output decreases 3 db from near zero beat to 10 kc. This results from the number of samples obtained per cycle of detected frequency. For example, the number of samples per cycle of 10 kc. is 2, while at 1 kc. there are 20 samples. The boxcar circuit thus can resolve frequencies more efficiently near zero beat.

If the pulse width equals the period of the frequency to be sampled, the average voltage applied to capacitor 60 is zero, and no detected frequency occurs. To synchronously detect 0–15 mc. requires that the maximum pulse width be less than $\frac{1}{15}$ microsecond. For example, 0.1 microsecond gate would permit a "dead spot" at 10 mc., at which no information could be obtained.

Following synchronous detector 25, there is amplifier 27. For the detector circuit of FIG. 5, for example, amplifier 27 may be comprised of an input stage which is a Darlington circuit which provides the preceding boxcar circuit of the synchronous detector an impedance greater than 10 megohms. An interstage 10 kc. low-pass filter is used to attenuate the 20 kc. sampling pulses and the other unwanted frequencies.

Figure 6:
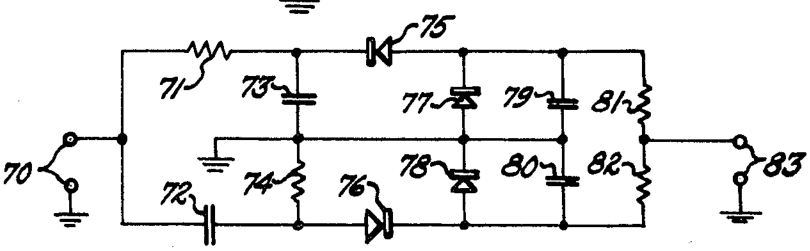
FIG. 6 shows a circuit diagram of the discriminator shown in FIG. 1.
Figure 7:
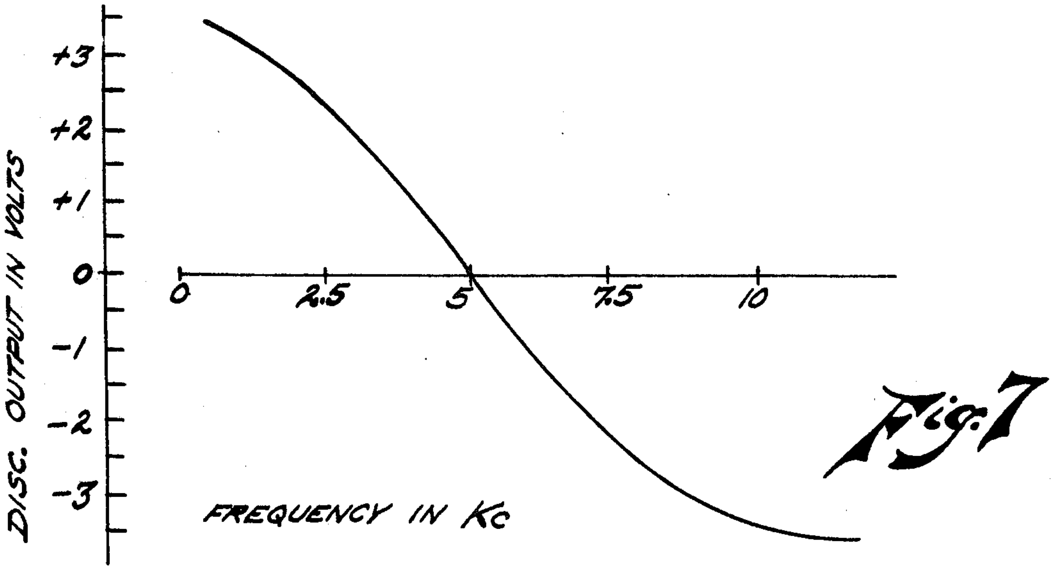
FIG. 7 shows the discriminator characteristic curve of FIG. 6.

One type of discriminator circuit which may be utilized is shown in FIG. 6 and the characteristic curve thereof in FIG. 7. The input is at terminal 70 and output at terminal 83. This may be a conventional ratio detector. The center frequency is 5 kc.; there, the steady state condition of the loop is with the signal 5 kc. away from the zero beat of the synchronous detector output. Furthermore, the signal in steady state will always be on one side of the zero beat in the band. Whether it is above or below is dependent upon the convections which determine loop sense. The loop sense which is chosen is of no consequence, since the signal may, during acquisition, be either increasing or decreasing in frequency with equal likelihood.

The discriminator has a slope characteristic that displays geometric symmetry. That is, the slope one octave above the center (10 kc.) is the same as the slope one octave below (2.5 kc.). The above-described components locked a voltage-controlled oscillator to a stability corresponding to 16 c.p.s. at 100 mc.

Figure 8:
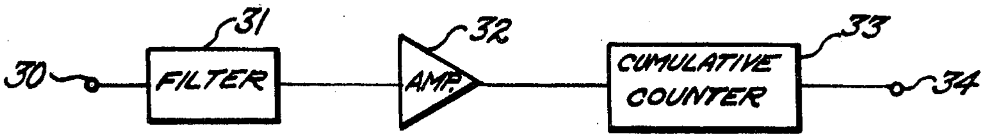
FIG. 8 shows additional apparatus in block diagram form to provide frequency readout of the system shown in FIG. 1.

Hereinbefore there was discussed a frequency readout system to be included with the stabilized swept voltage-controlled oscillator. Upon sweep-stop of the voltage-controlled oscillator, an instantaneous readout of frequency is provided by the apparatus shown in FIG. 8 wherein terminal 30 is the identical terminal 30 of FIG. 1. The synchronous detector output signal is fed to filter 31 which selects a portion of the input signal to be amplified. Filtering all but a small portion of the synchronous detector output provides periodic signals as the voltage-controlled oscillator is swept. These signals occur at intervals corresponding to the sampling rate and appear throughout the voltage-controlled oscillator band.

Filter 31 output is received by cumulative counter 33 by way of amplifier 32. Cumulative counting provides frequency readout available immediately after the voltage-controlled oscillator is stopped. Terminal 34 provides an output from counter 33.

It is to be noted that this invention has provided a sample technique and apparatus for frequency stabilization of a swept voltage-controlled oscillator. Utilizing this apparatus, as illustrated in FIG. 1, a spectral loop locked a swept voltage-controlled oscillator to a stability of 15 c.p.s. at 100 m.c.p.s. In addition thereto and wherever desirable apparatus has been provided for frequency readout of the stabilized swept voltage-controlled oscillator.

What is claimed is:

1. A stabilized swept voltage-controlled oscillator comprising a voltage-controlled oscillator sweeping over a predetermined frequency bandwidth, a crystal-controlled local oscillator having a predetermined frequency centered in said predetermined frequency bandwidth, an active mixer receiving the output signals from both of said oscillators for mixing purposes, a synchronous detector receiving the output signal from said mixer, means to gate on said synchronous detector with short time duration pulses at a preselected rate to provide a resultant signal from said synchronous detector, said resultant signal varying over a predetermined frequency range and having a repetitive beat frequency pattern occurring at said preselected rate as said voltage-controlled oscillator sweeps in frequency over said bandwidth, and discriminator means receiving said resultant signal, the discriminated signal being received by said voltage controlled oscillator for locking purposes.

2. A stabilized voltage-controlled oscillator as described in claim 1 and further including means to amplify said resultant signal to provide a constant gain characteristic.

3. A stabilized voltage-controlled oscillator as defined in claim 1 further including filter means for said discriminator signal to provide low-pass path to reduce ripple.

4. A stabilized voltage-controlled oscillator as defined in claim 1 further including frequency readout for said voltage-controlled oscillator comprising means to filter all but a small portion of said synchronous detector output signal to provide periodic signals as said voltage-controlled oscillator sweeps in frequency, said periodic signals occurring at intervals corresponding to said preselected rate and appearing throughout said bandwidth of said swept voltage-controlled oscillator, and cumulative counting means for said periodic signal to provide said frequency readout.

References Cited

UNITED STATES PATENTS 3,221,266 11/1965 Vitkovits ----------- 331—4 X

ROY LAKE, Primary Examiner

S. H. GRIMM, Assistant Examiner

U.S. Cl. X.R.

331—30, 33, 178; 307—233